US008896091B2

(12) United States Patent
Sun et al.

(10) Patent No.: US 8,896,091 B2
(45) Date of Patent: *Nov. 25, 2014

(54) APPARATUS AND METHODS FOR REDUCING IMPACT OF HIGH RF LOSS PLATING

(71) Applicant: Skyworks Solutions, Inc., Woburn, MA (US)

(72) Inventors: Weimin Sun, Santa Rosa Valley, CA (US); Peter J. Zampardi, Jr., Newbury Park, CA (US); Hongxiao Shao, Thousand Oaks, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/189,699

(22) Filed: Feb. 25, 2014

(65) Prior Publication Data

US 2014/0175629 A1    Jun. 26, 2014

Related U.S. Application Data

(63) Continuation of application No. 13/040,137, filed on Mar. 3, 2011, now Pat. No. 8,686,537.

(51) Int. Cl.
| | |
|---|---|
| *H01L 29/00* | (2006.01) |
| *H01L 29/80* | (2006.01) |
| *H01L 23/66* | (2006.01) |
| *H01L 23/495* | (2006.01) |
| *H01L 23/00* | (2006.01) |
| *H01L 23/64* | (2006.01) |
| *H01L 23/498* | (2006.01) |

(52) U.S. Cl.
CPC ............ *H01L 23/4952* (2013.01); *H01L 23/66* (2013.01); *H01L 2224/49111* (2013.01); *H01L 2223/6605* (2013.01); *H01L 2224/85464* (2013.01); *H01L 2224/48095* (2013.01); *H01L 2924/14* (2013.01); *H01L 2224/45144* (2013.01); *H01L 2224/85205* (2013.01); *H01L 23/49838* (2013.01); *H01L 24/49* (2013.01); *H01L 2924/01028* (2013.01); *H01L 2924/01029* (2013.01); *H01L 2224/85455* (2013.01); *H01L 2224/85444* (2013.01); *H01L 2924/00011* (2013.01); *H01L 23/642* (2013.01); *H01L 24/85* (2013.01)

USPC ............ 257/529; 257/531; 257/686; 257/777

(58) Field of Classification Search
USPC ........... 257/678–700, 777, E21.008, E21.022
See application file for complete search history.

(56) References Cited

U.S. PATENT DOCUMENTS

| | | | |
|---|---|---|---|
| 5,049,979 | A | 9/1991 | Hashemi et al. |
| 6,759,597 | B1 | 7/2004 | Cutting et al. |
| 6,798,050 | B1 | 9/2004 | Homma et al. |

(Continued)

FOREIGN PATENT DOCUMENTS

EP           1087648           3/2001

OTHER PUBLICATIONS

International Search Report issued on Nov. 16, 2012 in connection with related PCT Application No. PCT/US2012/027130 (WO 2012/118896).

*Primary Examiner* — Cuong Q Nguyen (74) *Attorney, Agent, or Firm* — Knobbe, Martens, Olson & Bear, LLP (57) ABSTRACT

To reduce the radio frequency (RF) losses associated with high RF loss plating, such as, for example, Nickel/Palladium/Gold (Ni/Pd/Au) plating, an on-die passive device, such as a capacitor, resistor, or inductor, associated with a radio frequency integrated circuit (RFIC) is placed in an RF upper signal path with respect to the RF signal output of the RFIC. By placing the on-die passive device in the RF upper signal path, the RF current does not directly pass through the high RF loss plating material of the passive device bonding pad.

20 Claims, 7 Drawing Sheets

(56) References Cited

U.S. PATENT DOCUMENTS

| | | |
|---|---|---|
| 6,930,334 B2 | 8/2005 | Suzuki et al. |
| 7,880,275 B2 | 2/2011 | Pagaila et al. |
| 8,134,228 B2 | 3/2012 | Komatsu et al. |
| 8,227,892 B2 | 7/2012 | Chang |
| 2003/0160307 A1 | 8/2003 | Gibson et al. |
| 2006/0255102 A1 | 11/2006 | Snyder et al. |
| 2008/0315356 A1 | 12/2008 | Reisner |
| 2009/0051036 A1 | 2/2009 | Abbott |
| 2009/0209064 A1 | 8/2009 | Nonahasitthichai et al. |
| 2011/0006415 A1 | 1/2011 | Bachman et al. |

APPARATUS AND METHODS FOR REDUCING IMPACT OF HIGH RF LOSS PLATING

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

1. Field

The present disclosure generally relates to the field of integrated circuit layout and packaging, and more particularly to systems and methods of layout and packaging of Radio Frequency (RF) integrated circuits (ICs).

2. Description of the Related Art

Silicon or other semiconductor wafers are fabricated into integrated circuits (ICs) as is known to one of ordinary skill in the art of IC fabrication. An IC is bonded and electrically connected to a carrier or substrate, which has layers of dielectric and metal traces, and packaged for use. A surface plating material is plated onto the top layer of copper traces to provide electrical connection points between the IC and the substrate, permitting the IC to interface with the outside world. Traditionally, nickel/gold (Ni/Au) has been a standard surface plating material for RFIC products and in certain situations, the RFIC is wire-bonded to the Ni/Au wire-bond pads plated on the surface of the substrate to form the electrical connections of the RFIC with its package. However, increases in gold prices have increased packaging costs associated with the Ni/Au surface plating.

SUMMARY

Systems and methods are disclosed to reduce the cost of RFIC packaging by using a Nickel/Palladium/Gold (Ni/Pd/Au) surface plating material for RFIC products. To decrease the costs, the gold layer in the Ni/Pd/Au surface plating is thinner than the gold layer in Ni/Au surface plating. However, Ni/Pd/Au has a much higher radio frequency sheet resistance than Ni/Au due to thin palladium and gold layers and the ferromagnetic nature of nickel. This contributes to reduced effective current sheet thickness and increased current crowding on the RF signals, and can, in some embodiments, lead to greater RF losses for RF signals traveling through the Ni/Pd/Au plated surfaces than are found on RF signals traveling through the Ni/Au plated surfaces. These losses can impact product performance and yield.

Further systems and methods are disclosed to reduce the RF losses associated with the lower cost Ni/Pd/Au surface plating for RFICs. In some embodiments of design layouts, the RF line/trace surface, edge, and sidewalls in the wire-bonding area are open to the plating process and are therefore plated with the Ni/Pd/Au surface finish. Due to the skin effect and eddy current effect on the RF current traveling through the plated wire-bonding areas, a majority of the RF current is running on the trace edges and side walls of the plated wire-bonding areas. Because a majority of the RF current is running on the trace edges and side walls, plating the trace edges and sidewalls contributes more to RF losses. To reduce the RF losses, some embodiments reconfigure the solder mask to cover the trace edges and sidewalls in the wire-bonding area such that the trace edges and sidewalls are not plated with the Ni/Pd/Au surface finish. The copper trace edges and sidewalls free from the Ni/Pd/Au plating around the wire-bonding areas provide a low resistive path for the RF current around the Ni/Pd/Au wire bond pad and thus, reduce the RF signal loss associated with the Ni/Pd/Au surface plating of the RFIC substrate.

In addition, systems and methods are disclosed to reduce the RF losses associated with the high RF loss bonding pad of an on-die capacitor, resistor, inductor, or other passive device of the RFIC. In some embodiments, RFICs include an on-die capacitor, resistor, inductor, or other passive device. The capacitor or passive device is bonded to the copper trace carrying the RF current. When a high RF loss bonding pad, such as a Ni/Pd/Au bonding pad, for example, is used to connect the passive device to the circuit traces of the RFIC module, the high RF loss bonding pad creates RF signal losses when the RF current flows through it. Placing the on-die capacitor, resistor, inductor, or other passive device in an RF upper trace with respect to the RF signal output of the RFIC reduces the RF losses associated with the on-die passive device bonding pad.

In certain embodiments, an electronic circuit module configured to reduce signal losses is disclosed. The module comprises an electronic circuit device having an output signal and a current associated therewith. Said electronic circuit device includes a first lead, a second lead, and an integrated circuit die having an on-die passive component. The electronic circuit module further comprises a substrate including a trace for conducting said current. Said trace has a first bonding pad on an upper signal path electrically connected to said first lead and a second bonding pad on a down signal path electrically connected to said second lead. Said electronic circuit device is configured such that said on-die passive component electrically connects to said first lead and said output signal electrically connects to said second lead. Said current thereby being directed away from said first bonding pad. In an embodiment, the electronic circuit module is a radio frequency integrated circuit module and the signal losses are radio frequency signal losses. In another embodiment the electronic circuit device is a radio frequency electronic circuit device, the output signal is a radio frequency output signal, and the current is a radio frequency current.

According to a number of embodiments, an electronic circuit device is configured to reduce signal losses. The device comprises an integrated circuit die having an on-die passive component, an output signal having an associated current, a first lead electrically connected to a first bonding pad located on an upper signal path of a trace on a substrate, and a second lead electrically connected to a second bonding pad located on a down signal path on said trace. Said electronic circuit device is configured such that said on-die passive component electrically connects to said first lead and said output signal electrically connects to the second lead. Said current thereby being directed away from said first bonding pad.

In accordance with various embodiments, a method for reducing signal losses in an electronic circuit module is disclosed. The method comprises fabricating an electronic circuit device including an integrated circuit die having an on-die passive component, and generating an output signal from the electronic circuit device. Said output signal has an associated current. The methods further comprises forming a first lead and a second lead on the electronic circuit device, forming a first bonding pad and a second bonding pad on a substrate, and forming a trace on the substrate to provide a conductive path to conduct the current between the first and the second bonding pads. The trace has an upper signal path associated with the first bonding pad and a down signal path associated with the second bonding pad. The method further comprises electrically connecting the first lead to the first bonding pad, electrically connecting the second lead to the second bonding pad, and configuring the electronic circuit device so that the on-die passive component electrically connects to the first lead and the output signal electrically connects to the second lead. The current thereby being directed away from the first bonding pad.

In an embodiment, an apparatus for reducing signal losses in an electronic circuit module is disclosed. The apparatus comprises means for fabricating an electronic circuit device including an integrated circuit die having an on-die passive component, and means for generating an output signal from the electronic circuit device. Said output signal has an associated current. The apparatus further comprises means for forming a first lead and a second lead on the electronic circuit device, means for forming a first bonding pad and a second bonding pad on a substrate, and means for forming a trace on the substrate to provide a conductive path to conduct the current between the first and the second bonding pads. The trace has an upper signal path associated with the first bonding pad and a lower signal path associated with the second bonding pad. The apparatus further comprises means for electrically connecting the first lead to the first bonding pad, means for electrically connecting the second lead to the second bonding pad, and means for configuring the electronic circuit device such that the on-die passive component electrically connects to the first lead and the output signal electrically connects to the second lead. The current thereby being directed away from the first bonding pad.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF CERTAIN EMBODIMENTS

The features of the systems and methods will now be described with reference to the drawings summarized above. Throughout the drawings, reference numbers are re-used to indicate correspondence between referenced elements. The drawings, associated descriptions, and specific implementation are provided to illustrate embodiments of the inventions and not to limit the scope of the disclosure.

Wire bonding is a technique for connecting electrical circuit devices, for example, integrated circuit (IC) die, to the next level of packaging. These circuit devices generally comprise a plurality of small conductive leads/pads that are electrically connected, for example, by ball bonding, wedge bonding, or the like, to wire bond pads on conductors embedded in the device package or substrate. The wire bond pads on the substrate provide the electrical connections between the IC and the substrate, permitting the IC to interface with the outside world. In either type of wire bonding, the wire is attached at both ends using some combination of heat, pressure, and ultrasonic energy to make a weld.

A plurality of copper patterns is formed on a substrate which is electrically connected to the circuit patterns, and a filler, such as a dielectric, is filled between the copper patterns such that an upper surface of the copper pattern is exposed. However, bare copper is not readily solderable or bondable and requires plating with a material that facilitates soldering or bonding. Areas that should not be solderable/bondable are covered with a material to resist plating. In general, solder resist refers to a polymer coating that acts as a mask and prevents the plating material from adhering to the masked copper traces. A surface plating material is plated onto the top layer of exposed copper traces to provide the wire bond pads. In some applications, wire bond pads are suited for wire bonding directly over active circuits to avoid damaging fragile devices and to lower metal resistance for power integrated circuits.

Figure 1:
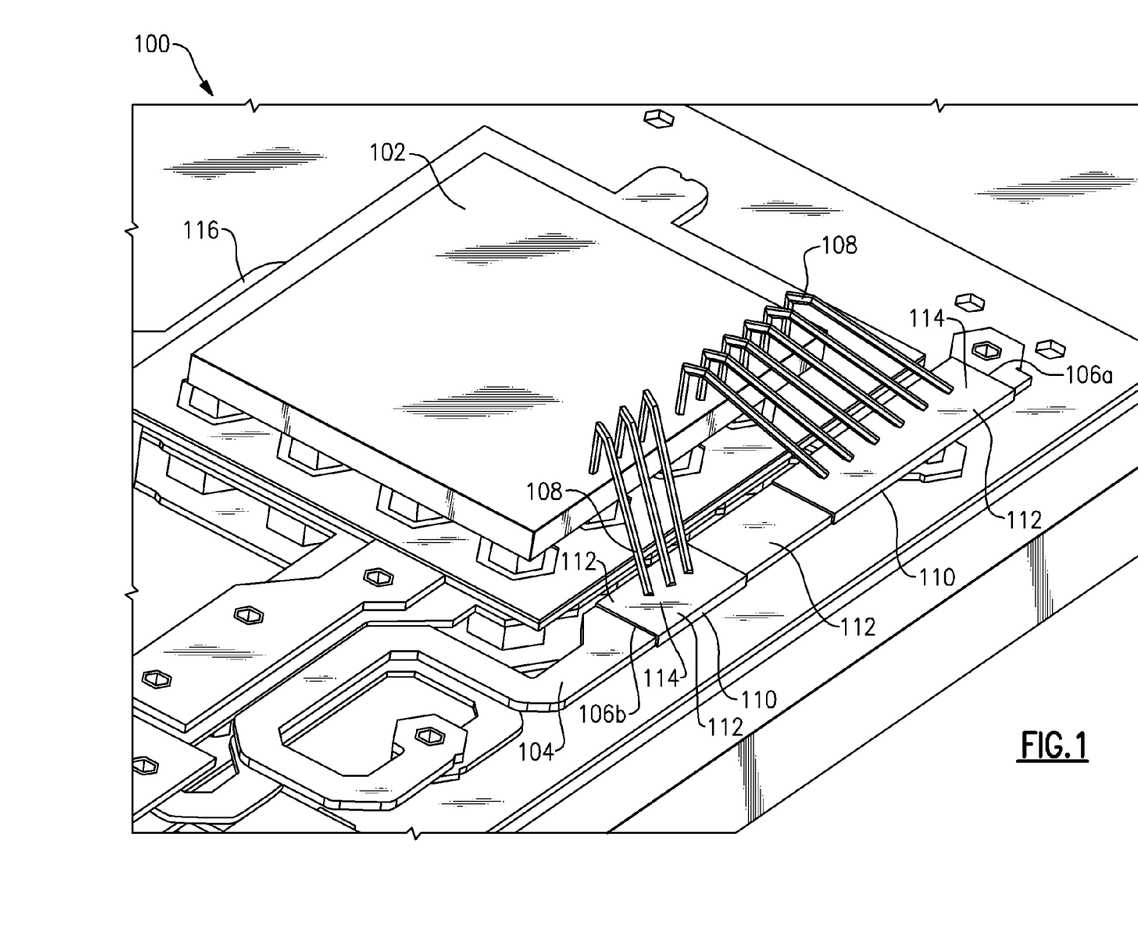
FIG. 1 illustrates an enlarged portion of an exemplary IC module comprising a wire bond pad, according to certain embodiments.

FIG. 1 illustrates a portion of an IC module 100 comprising an IC 102, a substrate 116, a copper trace 104, wire bond pads 106a, 106b, and bonding wires 108, according to an embodiment. The IC is wire bonded to wire bond pads 106 through wires 108. In the illustrated embodiment, wire bond pad 106a is a 6-wire wire bond pad and wire bond pad 106b is a 3-wire wire bond pad. In other embodiment, other numbers of wires 108 can be attached to the wire-bond pads 106. Wire bond pad 106 comprises a bond area 114, sidewalls 110, and edges 112.

Figure 2:
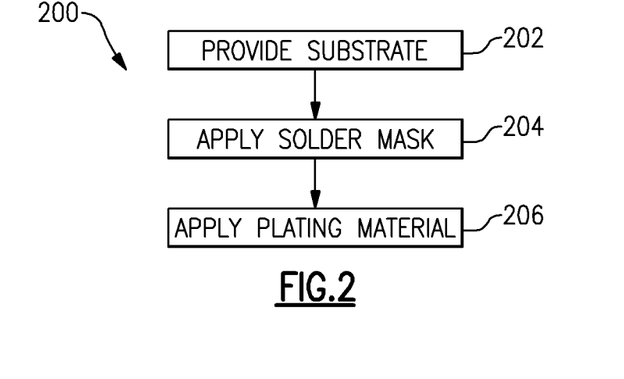
FIG. 2 illustrates a flow chart for an exemplary process for forming wire bond pads.

FIG. 2 illustrates a flow chart for an exemplary process 200 for forming wire bond pads. The process 200 is described with respect to the embodiment illustrated in FIG. 1. State 202 begins with a substrate 116 formed with layers of dielectrics and conductors 104, including a trace 104 on an upper surface of the substrate 116, to form circuit paths as is known to one of ordinary skill in the art of semiconductor fabrication.

At State 204, the process 200 applies solder mask to those areas of the IC module 100 that are to be kept free of plating material, as is known to one of ordinary skill in the art of semiconductor fabrication. A solder mask opening defines the areas to which the plating material will adhere. In some embodiments, the solder mask opening exposes the wire bond area 114, the sidewalls 110, and the edges 112 of the wire bond pad 106 to the plating material. In other embodiments, the trace 104 and the wire bond area 114, the sidewalls 110, and the edges 112 of the wire bond pad 106 are open to the plating process.

At State 206, the exposed areas (free of solder mask) of the copper trace 104 are plated with the plating material to form the wire bond pads 106 as is known to one of ordinary skill in the art of semiconductor fabrication.

In an embodiment, the plating material is nickel/gold (Ni/Au). At State 206, the nickel layer is plated over the copper trace 104 and the gold layer is plated over the nickel layer. Examples of plating techniques include, for example, immersion plating deposition, electrolytic plating, electroless plating, and the like.

In an embodiment, the copper trace is between about 5 microns and about 50 microns thick, and preferably approximately 20 microns. The nickel layer in the Ni/Au plating is between about 2.5 microns to about 7.6 microns thick, and more preferably, between about 5 microns to about 7 microns. The gold layer is approximately 0.70+/−0.2 microns thick, and more preferably approximately 0.5+/−0.1 microns.

Traditionally, Ni/Au has been a standard surface plating material for radio frequency integrated circuit (RFIC) products. Radio frequency (RF) is a rate of oscillation in the range of about 30 kHz to about 300 GHz. In an embodiment, the RFIC 102 is wire-bonded to Ni/Au wire-bond pads 106 plated on the surface of the substrate 116 to form the electrical connections of the RFIC 102 with its package. However, increases in gold prices have increased packaging costs associated with the Ni/Au surface plating.

To reduce packaging costs, a nickel/palladium/gold (Ni/Pd/Au) plating material is used to form wire bond pads for RFICs. In an embodiment, the RFIC 102 is wire-bonded to Ni/Pd/Au wire-bond pads 106 plated on the surface of the substrate 116 to form the electrical connections of the RFIC 102 with its package. The Ni/Pd/Au plating uses less gold than the Ni/Au plating material, and, as gold prices increase, the Ni/Pd/Au plating is advantageously less costly than the Ni/Au plating material.

Figure 3:
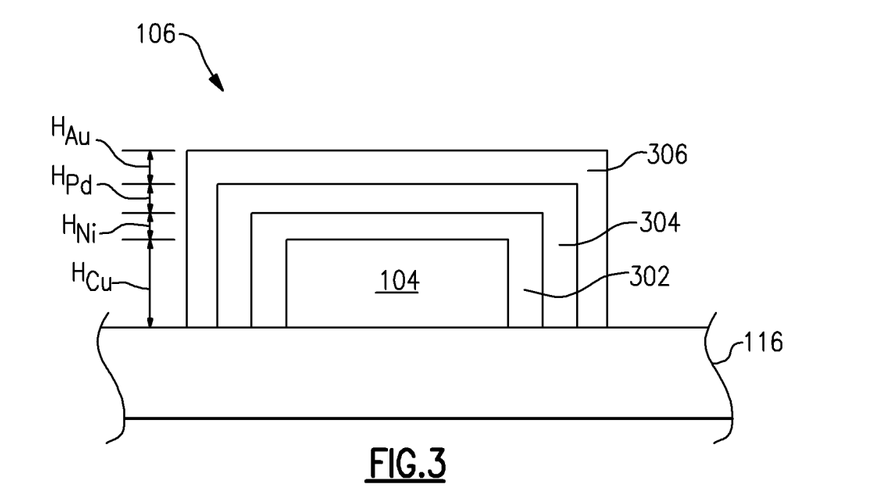
FIG. 3 illustrates a cross-section of a Ni/Pd/Au wire bond pad on the IC module of FIG. 1, according to an embodiment.

FIG. 3 illustrates a cross-section of the Ni/Pd/Au wire bond pad 106 on the surface of the substrate 116, according to an embodiment. The Ni/Pd/Au wire bond pad 106 comprises a nickel layer 302, a palladium layer 304, and a gold layer 306.

Referring to FIGS. 2 and 3, at State 206, the nickel layer 302 is plated over the copper trace 104; the palladium layer 304 is plated over the nickel layer 302, and the gold layer 306 is plated over the palladium layer 304. Examples of plating techniques include, for example, immersion plating deposition, electrolytic plating, electroless plating, and the like.

In an embodiment illustrated in FIG. 3, a height $H_{Cu}$ of the copper trace 104 is between about 5 microns and about 50 microns, and preferably 20 microns. A height $H_{Ni}$ of the nickel layer 302 is between about 2.5 microns to about 7.6 microns, and more preferably between about 5 microns to about 7 microns. A height $H_{Pd}$ of the palladium layer 304 is approximately 0.09+/−0.06 microns, and more preferably approximately 0.1+/−0.01 microns. A Height $H_{Au}$ of the gold layer 306 is approximately 0.10+/−0.05 microns, and more preferably approximately 0.1+/−0.01 microns.

However, the Ni/Pd/Au plated surface, due to the thin palladium and gold layers 304, 306 and the ferromagnetic nature of the nickel layer 302, has a higher sheet resistance at radio frequencies than the Ni/Au plated surface. Sheet resistance is applicable to two-dimensional systems where the thin film, such as surface finish plating for semiconductors, for example, is considered to be a two-dimensional entity. It is analogous to resistivity in three-dimensional systems. When the term sheet resistance is used, the current must be flowing along the plane of the sheet, not perpendicular to it.

In the Ni/Au wire pad embodiment described above, the sheet resistance of the Ni/Au is approximately 30 mΩ/square at 2 GHz whereas the sheet resistance of the Ni/Pd/Au in the Ni/Pd/Au wire bond pad embodiment described above and illustrated in FIG. 3 is approximately 150 mΩ/square at 2 GHz. Consequently, plating the wire bond pads 106 with the Ni/Pd/Au plating material instead the Ni/Au plating material can, in an embodiment, lead to extra RF losses. In turn, this can impact product performance and yield. In some embodiments, a Ni/Pd/Au plated surface may potentially increase RF loss by approximately 0.1 dB to approximately 0.4 dB, or equivalently impact power efficiency by approximately 1% to approximately 4%.

Further, oscillating signals are subject to skin effect. Skin effect is the tendency of an alternating electrical current to distribute itself within a conductor so that the current density near the surface of the conductor is greater than that at its core. That is, the electric current tends to flow at the skin of the conductor at an average depth called the skin depth. The skin effect causes the effective resistance of the conductor to increase with the frequency of the current because much of the conductor carries little current. Skin effect is due to eddy currents induced by the alternating current. As the frequency of the signal increases, to RF frequencies, for example, the skin depth decreases. In addition, the eddy currents also cause crowding of the alternating RF current at the edges of the conductor. Thus, a major portion of the RF current travels on the edge and sidewalls of the conductor 104.

Figure 4:
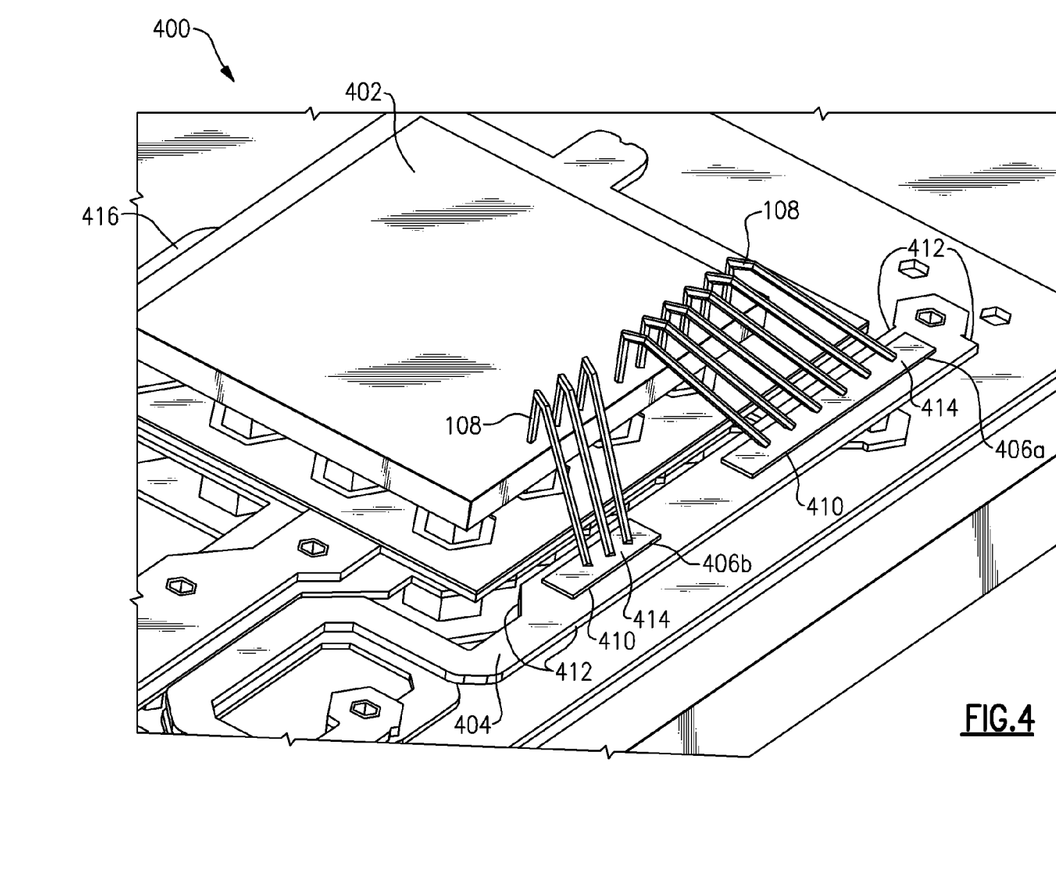
FIG. 4 illustrates an enlarged portion of an exemplary RFIC module comprising a wire bond pad, according to certain embodiments.

FIG. 4 illustrates an enlarged portion of an RFIC module 400 comprising an RFIC 402, a substrate 416, a copper trace 404, wire bond pads 406, and the bonding wires 108, according to an embodiment. The RFIC 402 is wire bonded to the wire bond pads 406 through the bonding wires 108. In the illustrated embodiment, a wire bond pad 406a is a 6-wire wire bond pad and a wire bond pad 406b is a 3-wire wire bond pad. In other embodiments, other numbers of wires 108, such as for example, 1, 2 3, 4, 5 or more than 6, can be attached to the wire-bond pads 406. The wire bond pad 406 comprises a bond area 414, sidewalls 410, and edges 412.

To reduce RF signal losses, the fabrication process can limit the Ni/Pd/Au wire bond pad 406 to the bond area 414, leaving the sidewalls 410 and edges 412 free from the Ni/Pd/Au plating material. The majority of the RF current travels through the unplated edges and side walls surrounding the plated wire bond area 414, instead of traveling through the plated edge 412 and sidewalls 410 as illustrated in FIGS. 1 and 3. Thus, the RF losses are reduced.

Figure 5:
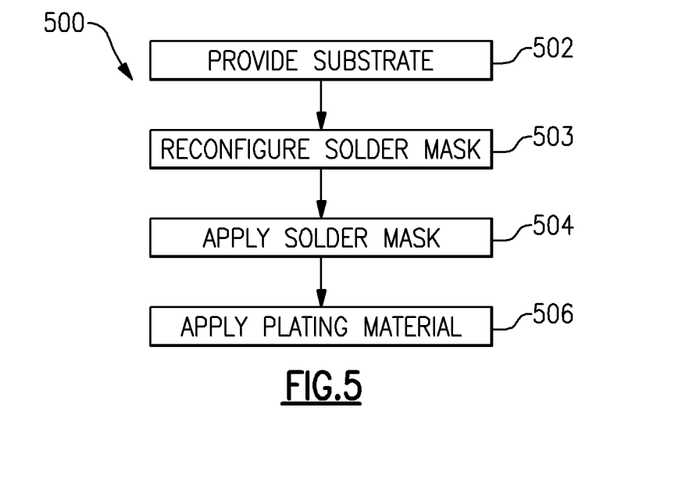
FIG. 5 illustrates a flow chart for an exemplary process for forming Ni/Pd/Au wire bond pads, according to certain embodiments.

FIG. 5 illustrates a flow chart for an exemplary process 500 for forming Ni/Pd/Au wire bond pads 406, according to an embodiment. The process 500 is described with respect to the embodiment illustrated in FIG. 4. State 502 begins with the substrate 416 formed with layers of dielectrics and conductors 404, including trace 404 on an upper surface of the substrate 416, to form circuit paths as is known to one of ordinary skill in the art of semiconductor fabrication.

At State 503, in an embodiment, the solder mask is reconfigured to cover the edges 412 and sidewalls 410 of the wire bond pads 406. In another embodiment, the solder mask is reconfigured to cover the trace 404, and the edges 412 and the sidewalls 410 of the wire bond pads 406. The solder mask opening covers the wire bond area 414, such that the wire bond area 414 is open to the plating process, while the edges 412 and the sidewalls 410 are not. In an embodiment, the width of the edge 412 covered by the solder mask should be at least wider than the solder mask opening registration tolerance. In another embodiment, the width of the edge 412 covered by the solder mask is approximately 10 microns to 200 microns, and preferably 50 microns to 100 microns.

At State 504, the process 500 applies the reconfigured solder mask to the RFIC module 400, as is known to one of ordinary skill in the art of semiconductor fabrication.

At State 506, the process 500 plates the RFIC module 400 with the Ni/Pd/Au plating material to form the wire bond pads 406 as is known to one of ordinary skill in the art of semiconductor fabrication. Examples of plating techniques include, for example, immersion plating deposition, electrolytic plating, electroless plating, and the like.

Figure 6:
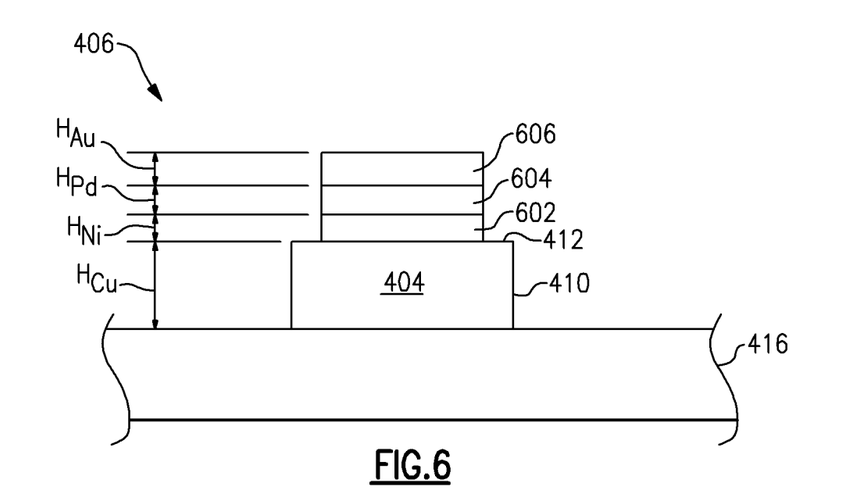
FIG. 6 illustrates a cross-section of a Ni/Pd/Au wire bond pad on the RFIC module of FIG. 4, according to an embodiment

FIG. 6 illustrates a cross-section of the Ni/Pd/Au wire bond pad 406 on the surface of the substrate 416, according to an embodiment. The Ni/Pd/Au wire bond pad 406 comprises a nickel layer 602, a palladium layer 604, and a gold layer 606. As illustrated in FIG. 6, the edges 412 and sidewalls 410 of the Ni/Pd/Au wire bond pad 406 are free from the Ni/Pd/Au plating.

Referring to FIGS. 5 and 6, the nickel layer 602 is plated over the copper trace 404; the palladium layer 604 is plated over the nickel layer 602, and the gold layer 606 is plated over the palladium layer 604. Examples of plating techniques include, for example, immersion plating deposition, electrolytic plating, electroless plating, and the like.

In an embodiment illustrated in FIG. 6, a height $H_{Cu}$ of the copper trace 404 is between about 5 microns and about 50 microns, and preferably approximately 20 microns. A height $H_{Ni}$ of the nickel layer 602 is between about 2.5 microns to about 7.6 microns, and more preferably between about 5 microns to about 7 microns. A height $H_{Pd}$ of the palladium layer 604 is approximately 0.09+/−0.06 microns, and more preferably approximately 0.1+/−0.01 microns. A height $H_{Au}$ of the gold layer 606 is approximately 0.10+/−0.05 microns, and more preferably approximately 0.1+/−0.01 microns.

Figure 7:
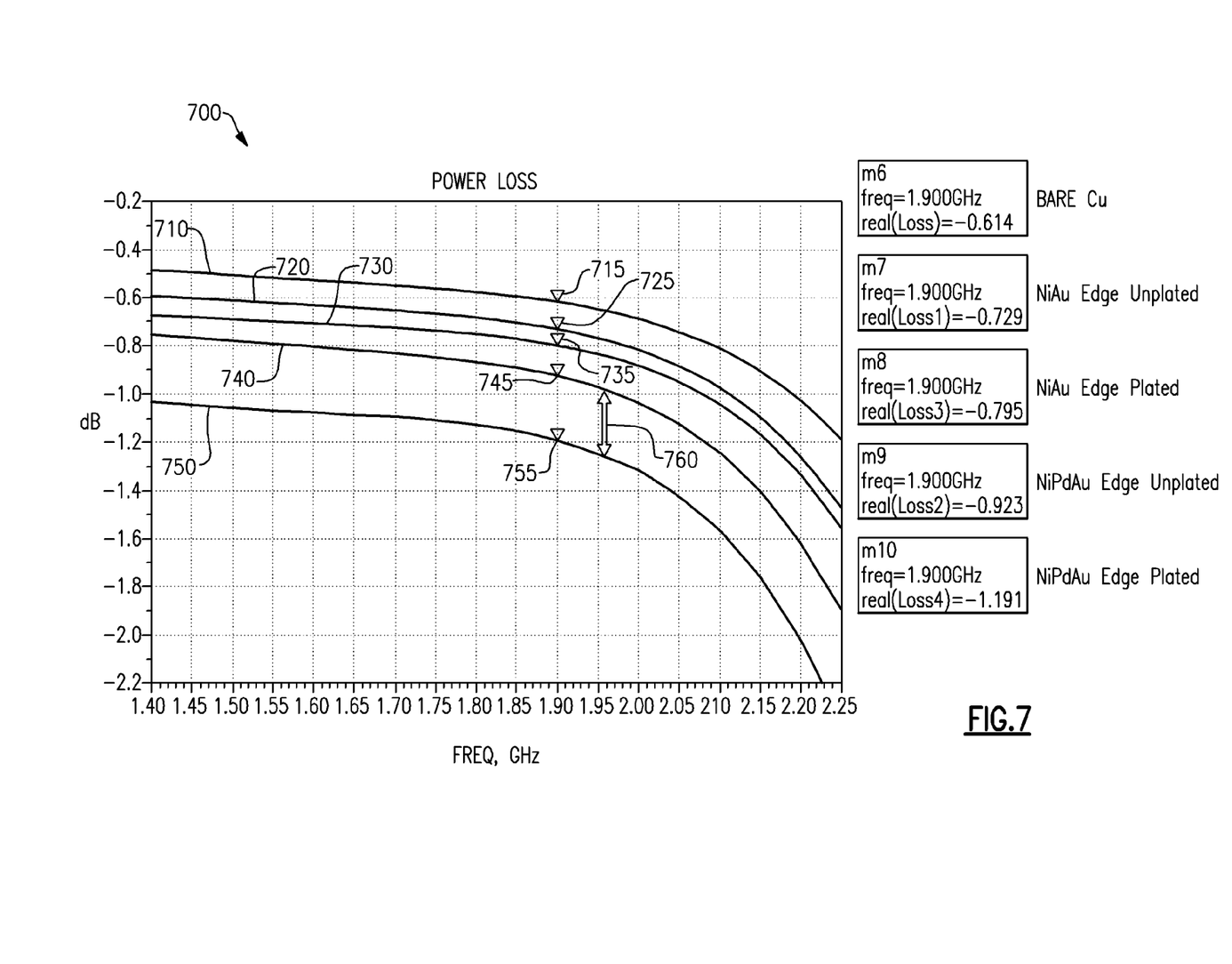
FIG. 7 is a graph comparing the RF losses for traces with edge/sidewall exposed surfaces and edge/sidewall plated surfaces, according to certain embodiments.

FIG. 7 is a graph 700 comparing the RF losses for traces with edge/sidewall exposed surfaces and edge/sidewall plated surfaces, according to an embodiment. The graph 700 shows power loss expressed in decibels (dBs) along the y or vertical axis and frequency expressed in gigahertz (GHz) along the x or horizontal axis. The power loss of the RF signals is calculated as $10 \log_{10}[RFpowerout/RFpower in]$ at frequencies ranging from about 1.40 GHz to about 2.25 GHz.

The graph 700 comprises lines 710, 720, 730, 740, and 750, representing the power loss of an RF signal through various traces on an RFIC substrate. Line 710 indicates an RF power loss of the RF signal through a bare copper trace (no surface finish). At approximately 1.9 GHz, as indicated by point 715, the power loss is approximately 0.614 dB.

Line 720 indicates the power loss of the RF signal through a copper trace comprising a Ni/Au bonding pad having its edges and sidewalls free from plating, while line 730 indicates the power loss through a copper trace comprising a Ni/Au bonding pad with its edges and sidewalls plated with the Ni/Au plating material. Point 725 on line 720 indicates the power loss to be approximately 0.729 dB at approximately 1.9 GHz and point 735 on line 730 indicates the power loss to be approximately 0.795 dB at approximately 1.9 GHz.

Line 740 indicates the power loss of the RF signal through a copper trace comprising a Ni/Pd/Au bonding pad having its edges and sidewalls free from plating, while line 750 indicates the power loss through a copper trace comprising a Ni/Pd/Au bonding pad with its edges and sidewalls plated with the Ni/Pd/Au plating material. Point 745 on line 740 indicates the power loss to be approximately 0.923 dB at approximately 1.9 GHz and point 755 on line 750 indicates the power loss to be approximately 1.191 dB at approximately 1.9 GHz.

Referring to the embodiments illustrated in FIG. 7, the bare copper trace (line 710) provides the least power loss and the trace comprising the Ni/Pd/Au bonding pad having plated edges and sidewalls (line 750) provides the greatest RF power loss. Traces with Ni/Au bonding pads (lines 720, 730) create less power loss to the RF signal than traces with Ni/Pd/Au bonding pads (lines 740, 750). Comparing the traces comprising the Ni/Au bonding pad, the trace with exposed edge and sidewalls (line 720) creates less power loss than the trace with the plated edge and sidewalls (line 730). Similarly, the trace with the Ni/Pd/Au bonding pad with exposed edge and sidewalls (line 740) creates less power loss to the RF signal than the trace comprising the Ni/Pd/Au bonding pad with plated edges and sidewalls (line 750). As indicated by arrow 760, in an embodiment, the RF power loss for the RF signal passing through the Ni/Pd/Au bonding pad that does not have its edges and sidewalls plated with the Ni/Pd/Au plating material is approximately 0.26 dB less than the RF power loss of the RF signal passing through the Ni/Pd/Au bonding pad with Ni/Pd/Au plated edges and sidewalls.

Wafer fabrication generally refers to the process of building integrated circuits on silicon or semiconductor wafers. Many processes exist, known to one of ordinary skill in the art of wafer fabrication, such as, for example, epitaxy, masking and etching, diffusion, ion implant, deposition of polysilicon, dielectric fabrication, lithography/etching, deposition of thin films, metallization, glassivation, probing/trimming of each die on the wafer, and the like, to create integrated circuits to the designers specifications.

In certain embodiments, it is desirable to locate an on-die passive device, such as a resistor, capacitor, inductor, or the like, on a RFIC, which further comprises an RF output signal. The on-die passive device can function as a filter, a shunt filter, a trapper for harmonic frequencies, or the like, in the RF circuit.

Figure 8:
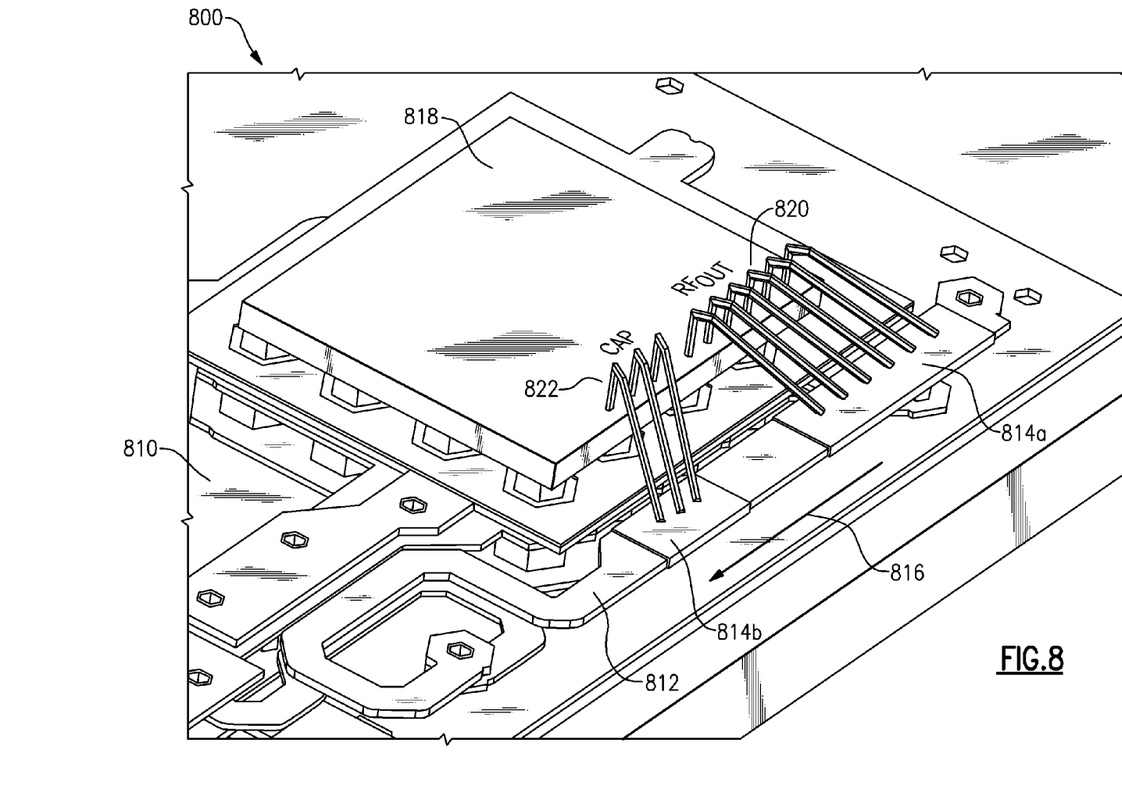
FIG. 8 illustrates an enlarged portion of an RFIC module having an RFIC with an on-die passive device, according to an embodiment.

FIG. 8 illustrates an enlarged portion of an RFIC module 800 comprising a substrate 810 and an RFIC 818. Additional circuitry is omitted for simplicity. The substrate 810 comprises an RFIC circuit trace 812, and wire-bonding pads 814a, 814b. In an embodiment, the wire-bonding pads 814a, 814b comprise Ni/Pd/Au. In another embodiment, the wire-bonding pads 814a, 814b comprise a high RF loss plating material. In a further embodiment, the wire bonding pads 814a, 814b comprise Ni/Au. In an embodiment, the wire bonding pads 814a, 814b are formed with plated edges and sidewalls, as illustrated in FIG. 8. In another embodiment, the wire bonding pads 814a, 814b are formed with edges and sidewalls free from the surface plating material.

The RFIC 818 comprises an RF output 820, and an on-die passive device 822, such as a capacitor 822. The RF output 820 is the location on the RFIC 818 from which the RF output signal from the RFIC's internal circuitry exits the RFIC 818 and inputs into the RF circuitry of the module 800. In an embodiment, the layout of the RFIC 818 is configured such that the capacitor 822 is placed in the RF circuit 812 of the RF module 800 after the RF output 820. In this layout, when the RF output 820 is wire bonded to wire bonding pad 818a and the on-die capacitor 822 is wire bonded to wire bonding pad 814b, the on-die capacitor 822 is between the RF output 820 of the RFIC 818 and the RF output of the module 800.

An arrow 816 indicates the direction of RF current flow of the RF signal. As shown, the RF current flows from the RF output signal 820 to the RF output of the module 800. Portions of the RF trace 812 that are between the RF output signal 820 and the RF output of the module 800 are in the RF signal down path and portions of the trace 812 that are located above the RF output 820 that do not receive the RF current flow are in the RF signal upper path. In FIG. 8, the capacitor bonding pad 814b is located in the RF down path. In other words, the RF current passes through the capacitor wire-bond pad 814b when traveling from the RF output 820 to the rest of the circuitry on the substrate 810. In an embodiment, passing the RF signal through the high RF loss plating material, such as the Ni/Pd/Au capacitor bonding pad 814b, creates additional RF signal losses.

Figure 9:
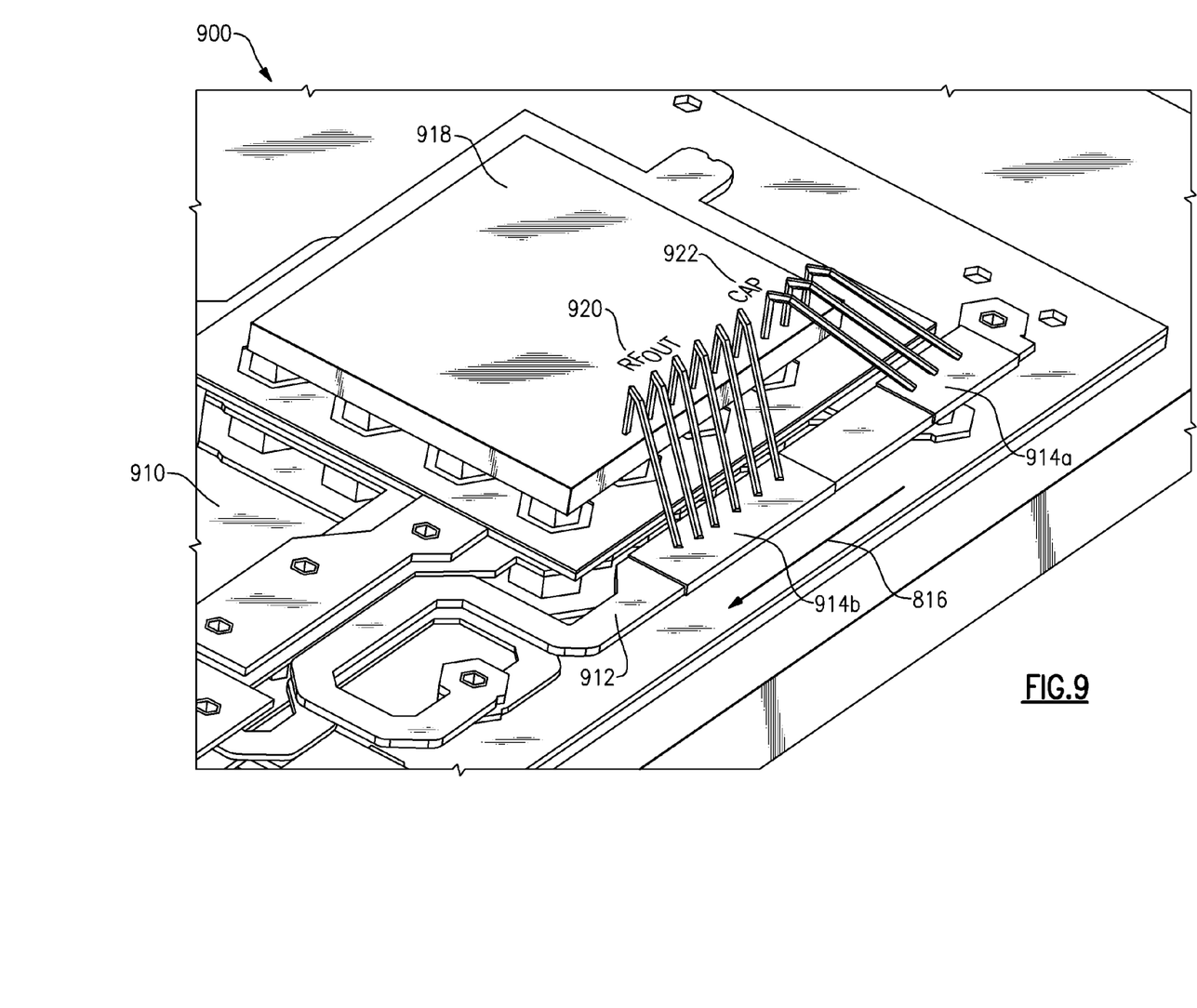
FIG. 9 illustrates an enlarged portion of an RFIC module having an RFIC with an on-die passive device, according to another embodiment.

FIG. 9 illustrates the enlarged portion of an RFIC module 900 comprising a substrate 910 and an RFIC 918. Additional circuitry is omitted for simplicity. The substrate 910 comprises an RFIC circuit trace 912, and wire-bonding pads 914a, 914b. In an embodiment, the wire-bonding pads 914a, 914b comprise Ni/Pd/Au. In another embodiment, the wire-bonding pads 914a, 914b comprise a high RF loss plating material. In a further embodiment, the wire bonding pads 914a, 914b comprise Ni/Au. In an embodiment, the wire bonding pads 914a, 914b are formed with plated edges and sidewalls, as illustrated in FIG. 9. In another embodiment, the wire bonding pads 914a, 914b are formed with edges and sidewalls free from the surface plating material.

The layout of the RFIC 918 has been reconfigured to reduce the RF losses associated with the RF current flowing through the high RF loss bonding pad of the on-die passive device. The RFIC 918 comprises an RF output 920, and an on-die passive device 922, such as a capacitor 922. The RF output 920 is the location on the RFIC 918 from which the RF output signal from the RFIC's internal circuitry exits the RFIC 918 and inputs into the RF circuitry of the module 900. In an embodiment, the layout of the RFIC 918 is configured such that the capacitor 922 is placed in the RF circuit 912 of the RF module 900 before the RF output 920. In this layout, when the RF output 920 is wire bonded to wire bonding pad 914b and the on-die capacitor 922 is wire bonded to wire bonding pad 914a, the on-die capacitor 922 is not between the RF output 920 of the RFIC 918 and the RF output of the module 900.

The arrow 816 again indicates the direction of RF current flow of the RF signal. As shown, the RF current flows from the RF output signal 920 to the RF output of the module 900. In FIG. 9, the passive device bonding pad 914a is located in the RF upper path. In other words, the RF current does not pass through the passive device wire-bond pad 914a when traveling from the RF output 920 to the rest of the circuitry on the substrate 910. Thus, in an embodiment, placing the on-die passive device in the layout of the RFIC 918 such that bonding pad 914a on the substrate 910 for the on-die passive device is in the RF upper signal path reduces the RF signal loss that is associated with placing the on-die passive device bonding pad 914a in the RF signal down path.

To reduce costs, in some embodiments, Ni/Pd/Au instead of Ni/Au is plated onto the surface traces of substrates for RFIC modules to form wire-bond areas. However, Ni/Pd/Au has a higher RF sheet resistance than Ni/Au and this leads to higher RF losses for signals traveling through Ni/Pd/Au wire-bond areas than for signals traveling through Ni/Au wire-bond areas. To reduce the RF losses associated with high RF loss plating, such as, for example, Ni/Pd/Au plating, an on-die passive device, such as a capacitor, resistor, inductor, or the like, associated with an RFIC is placed in an RF upper path with respect to the RFIC output signal. By laying out the IC with the passive device in the RF signal upper path, the RF signal current does not pass through the high RF loss bonding pad of the passive device when module is assembled.

While embodiments have been described with respect to Ni/Pd/Au surface plating, the disclosed systems and methods apply to any high RF loss surface plating, such as, for example, Sn, Pb, other surfaces of ferromagnetic materials, and the like.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The words "coupled" or connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of certain embodiments is not intended to be exhaustive or to limit the invention to the precise form disclosed above. While specific embodiments of, and examples for, the invention are described above for illustrative purposes, various equivalent modifications are possible within the scope of the invention, as those ordinary skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An electronic circuit module configured to reduce signal losses, the module comprising:
an electronic circuit device including a first lead, a second lead, and an integrated circuit die having an on-die passive component, the electronic circuit device configured to have an output signal and current associated with the output signal when the electronic circuit device is activated; and
a trace configured to conduct the current from the output signal to an output of the electronic circuit module, the trace having a first bonding pad electrically connected to the first lead and a second bonding pad located on the trace between the first bonding pad and the output of the electronic circuit module and electrically connected to the second lead, the electronic circuit device configured such that the on-die passive component electrically connects to the first lead and the output signal electrically connects to the second lead, the current thereby being directed away from the first bonding pad.

2. The module of claim 1 wherein the electronic circuit device is a radio frequency electronic circuit device, the output signal is a radio frequency output signal, and the current is a radio frequency current.

3. The module of claim 1 wherein the integrated circuit die is a radio frequency integrated circuit die.

4. The module of claim 1 wherein the first and second bonding pads are plated with a surface plating material including nickel, palladium, and gold.

5. The module of claim 1 wherein the first and the second bonding pads are plated with a surface plating material including nickel and gold.

6. The module of claim 1 wherein the first bonding pad and the second bonding pad each include at least one edge, at least one sidewall, and a bonding area, the at least one edge and the at least one sidewall of each of the first and second bonding pads being free from plating material.

7. The module of claim 1 wherein the first bonding pad and the second bonding pad each include at least one edge, at least one sidewall, and a bonding area, the at least one edge, the at least one sidewall, and the bonding area of each of the first and second bonding pads plated with a surface plating material.

8. An electronic circuit device configured to reduce signal losses, the device comprising:
an integrated circuit die having an on-die passive component;
a first lead configured to be electrically connected to a first bonding pad located on a trace; and
a second lead configured to be electrically connected to a second bonding pad on the trace, the electronic circuit device configured to have an output signal and a current associated with the output signal when the electronic circuit device is activated, the trace conducting the current from the output signal to other circuitry associated with the trace, the second bonding pad located between the first bonding pad and the other circuitry, the electronic circuit device configured such that the on-die passive component electrically connects to the first lead and the output signal electrically connects to the second lead, the current thereby being directed away from the first bonding pad.

9. The device of claim 8 wherein the integrated circuit die is a radio frequency integrated circuit die.

10. The device of claim 8 wherein the output signal is a radio frequency output signal and the current is a radio frequency current.

11. The device of claim 8 wherein the first bonding pad and the second bonding pad each include at least one edge, at least one sidewall, and a bonding area, the at least one edge and the at least one sidewall of each of the first and second bonding pads being free from plating material.

12. The device of claim 8 wherein the first bonding pad and the second bonding pad each include at least one edge, at least one sidewall, and a bonding area, the at least one edge, the at least one sidewall, and the bonding area of each of the first and the second bonding pads plated with a surface plating material.

13. The device of claim 8 wherein the first and the second bonding pads are wire bonding pads.

14. A method for reducing signal losses in an electronic circuit module, the method comprising:
fabricating an electronic circuit device including an integrated circuit die having an on-die passive component, the electronic circuit device configured to generate an output signal having an associated current when the electronic circuit device is activated;
forming a first lead and a second lead on the electronic circuit device;
forming a trace to conduct the current from the output signal to an output of the electronic circuit module;
forming a first bonding pad on the trace and a second bonding pad on the trace between the first bonding pad and the output of the electronic circuit module;
electrically connecting the first lead to the first bonding pad and electrically connecting the second lead to the second bonding pad; and
configuring the electronic circuit device so that the on-die passive component electrically connects to the first lead and the output signal electrically connects to the second lead, the current thereby being directed away from the first bonding pad.

15. The method of claim 14 wherein the electronic circuit module is a radio frequency electronic circuit module and the signal losses are radio frequency signal losses.

16. The method of claim 14 wherein the electronic circuit device is a radio frequency electronic circuit device, the output signal is a radio frequency output signal, and the current is a radio frequency current.

17. The method of claim 14 wherein the integrated circuit die is a radio frequency integrated circuit die.

18. The method of claim 14 wherein the first and the second bonding pads are plated with a surface plating material including nickel, palladium, and gold.

19. The method of claim 14 wherein the first and the second bonding pads are plated with a surface plating material including nickel and gold.

20. The method of claim 14 wherein the first bonding pad and the second bonding pad are wire bonding pads.

* * * * *